United States Patent
AuBuchon

(10) Patent No.: US 11,560,624 B2
(45) Date of Patent: Jan. 24, 2023

(54) PRECURSOR DELIVERY SYSTEM

(71) Applicant: Applied Materials, Inc., Santa Clara, CA (US)

(72) Inventor: Joseph AuBuchon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 16/555,759

(22) Filed: Aug. 29, 2019

(65) Prior Publication Data

US 2020/0071827 A1     Mar. 5, 2020

Related U.S. Application Data

(60) Provisional application No. 62/725,825, filed on Aug. 31, 2018.

(51) Int. Cl.
C23C 16/455     (2006.01)

(52) U.S. Cl.
CPC .. *C23C 16/45544* (2013.01); *C23C 16/45561* (2013.01)

(58) Field of Classification Search
CPC .......... C23C 16/4481; C23C 16/45561; C23C 16/45544
See application file for complete search history.

(56) References Cited

U.S. PATENT DOCUMENTS

| | | |
|---|---|---|
| 6,984,591 B1 | 1/2006 | Buchanan et al. |
| 9,431,220 B1 | 8/2016 | Ohashi et al. |
| 2005/0095859 A1 | 5/2005 | Chen et al. |
| 2005/0166847 A1 | 8/2005 | Derderian |
| 2009/0186479 A1 | 7/2009 | Okabe et al. |
| 2010/0285206 A1 | 11/2010 | Woelk et al. |
| 2011/0311726 A1* | 12/2011 | Liu .................... C23C 16/45544 118/695 |
| 2014/0308445 A1 | 10/2014 | Na et al. |
| 2017/0096735 A1 | 4/2017 | Kumar et al. |
| 2017/0159175 A1* | 6/2017 | Yagi ........................ C23C 16/52 |
| 2017/0275757 A1 | 9/2017 | Kikuchi et al. |

FOREIGN PATENT DOCUMENTS

| | | |
|---|---|---|
| JP | H11117070 A | 4/1999 |
| JP | 2014207459 A | 10/2014 |
| JP | 2017017274 A | 1/2017 |
| JP | 2017179397 A | 10/2017 |
| WO | 2007143743 A2 | 12/2007 |
| WO | 2009/015271 A1 | 1/2009 |

OTHER PUBLICATIONS

PCT International Search Report and Written Opinion in PCT/US2019/048992 dated Dec. 4, 2019, 12 pages.

* cited by examiner

*Primary Examiner* — Yuechuan Yu

(74) *Attorney, Agent, or Firm* — Servilla Whitney LLC

(57) ABSTRACT

A precursor delivery system is described herein. Some embodiments provide a precursor delivery system capable of providing a uniform gas flow comprising precursor into a processing chamber for atomic layer deposition processes. Some embodiments of the precursor delivery system comprise a reservoir with an inlet line, an outlet line and an outlet valve. Further embodiments comprise a precursor source, an inlet valve, a heater, a processing chamber and a controller. Additional embodiments relate to methods for using a precursor delivery system.

13 Claims, 3 Drawing Sheets

PRECURSOR DELIVERY SYSTEM

CROSS-REFERENCE TO RELATED APPLICATIONS

This application claims priority to U.S. Provisional Application No. 62/725,825, filed Aug. 31, 2018, the entire disclosure of which is hereby incorporated by reference herein.

TECHNICAL FIELD

Embodiments of the present disclosure generally relate to precursor delivery systems. Some embodiments of the disclosure relate to precursor delivery systems for use in atomic layer deposition processes.

BACKGROUND

Efficient atomic layer deposition processes require that a precursor be pulsed into a chamber in a relatively short period of time. As device requirements grow increasingly smaller, the surface area of these devices increases. Accordingly, the amount of precursor which must be delivered to the substrate for complete saturation also increases.

Additionally, current delivery systems often fail to deliver consistent precursor concentrations over time. In some cases, the pulse delivered is higher in concentration at the beginning of a pulse than at the end of a pulse. In some cases, the concentration of precursor is higher at the beginning of a process than at the end of a process. These variations can lead to irregular deposition and device failure. Further, some current delivery systems often deliver precursor pulses which contain particles of solid precursors.

Accordingly, there is a need for precursor delivery systems which provide consistent, high concentration pulses of precursors.

SUMMARY

One or more embodiments of the disclosure relate to precursor delivery system comprising a reservoir with an inlet line and an outlet line, an outlet valve on the outlet line, and a controller connected to the outlet valve. The controller is configured to close the outlet valve to pressurize the reservoir and open the outlet valve to provide a uniform flow of gas from the reservoir through the outlet line.

Additional embodiments of the disclosure relate to a method of precursor delivery comprising using a controller to charge a reservoir with a precursor. The controller is configured to open an inlet valve on an inlet line and close an outlet valve on an outlet line. The inlet line and outlet line are in fluid communication with the reservoir. The controller is used to provide a flow of precursor from the charged reservoir through the outlet line. The controller is configured to open the outlet valve.

Further embodiments of the disclosure relate to a precursor delivery system comprising a reservoir with an inlet line and an outlet line, a precursor source in fluid communication with the inlet line, a processing chamber in fluid communication with the outlet line, an outlet valve on the outlet line, and a controller connected to the outlet valve. The controller is configured to close the outlet valve to pressurize the reservoir and open the outlet valve to provide a uniform flow of gas from the reservoir to the processing chamber.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
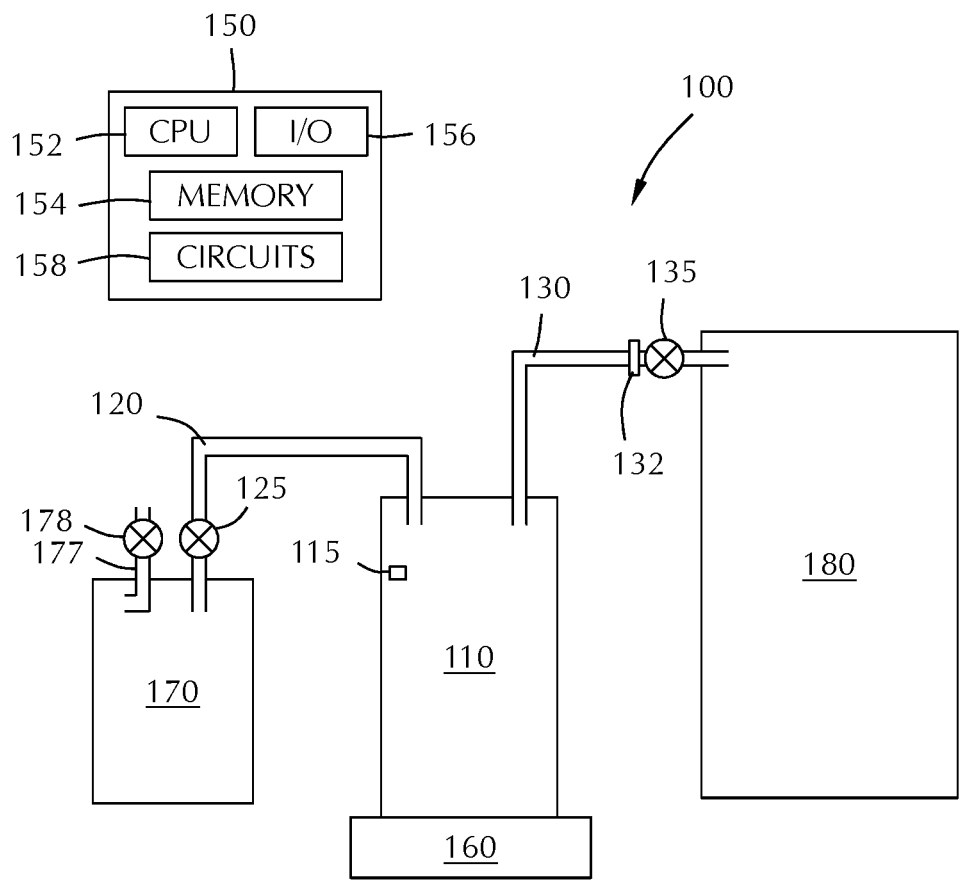
FIG. 1 shows a schematic representation of a precursor delivery system according to some embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to apparatus and methods for precursor delivery during a vapor phase deposition process (e.g., an atomic layer deposition process). Some embodiments of the disclosure advantageously provide for the delivery of higher precursor concentrations in a shorter period of time relative to conventional precursor delivery systems. Some embodiments of the disclosure advantageously provide apparatus and methods which have the ability to burst a high dose of chemistry into a processing chamber. High burst delivery processes may be useful for deposition on high surface area structured wafers.

Some embodiments advantageously provide for greater control over the amount of precursor delivered to a process chamber during an atomic layer deposition (ALD) pulse. Some embodiments of the disclosure advantageously provide for the delivery of more consistent precursor concentrations over time during a substrate processing method. Some embodiments of the disclosure advantageously provide for the delivery of a precursor with fewer solid particles and lower levels of particle entrainment in resulting films.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface are exposed simultaneously to the two or more reactive compounds so that no given point on the substrate is exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second reactive gas (i.e., a second precursor or compound B) is pulsed into the reaction zone followed by a second delay. During each time delay, a purge gas, such as argon or helium, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive gases are alternatively pulsed until a desired film or film thickness is formed on the substrate surface. In either scenario, the ALD process of pulsing compound A, purge gas, compound B and purge gas is referred to as a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In some embodiments, the reactant comprises an inert, diluent and/or carrier gas. The inert, diluent and/or carrier gas may be mixed with the reactive species and can be pulsed or have a constant flow. In some embodiments, the carrier gas is flowed into the processing chamber at a constant flow in the range of about 1 to about 20000 sccm. The carrier gas may be any gas which does not interfere with the film deposition. For example the carrier gas may comprises one or more of argon, helium, nitrogen, neon, or the like, or combinations thereof. In one or more embodiments, the carrier gas is mixed with the reactive species prior to flowing into the reservoir.

Referring to FIG. 1, some embodiments of the disclosure are directed to precursor delivery systems 100. The precursor delivery system 100 comprises a reservoir 110 with an inlet line 120 and an outlet line 130. The precursor delivery system 100 further comprises an outlet valve 135 on the outlet line 130. In some embodiments, the precursor delivery system 100 further comprises a controller 150 connected to the outlet valve 135. In some embodiments, a controller 150 is configured to close the outlet valve 135 to pressurize the reservoir 110 and open the outlet valve 135 to provide a uniform flow of gas from the reservoir 110 through the outlet line 130 to a downstream component, for example, a processing chamber 180.

In some embodiments, a carrier gas comprising a precursor is delivered to the reservoir 110 through the inlet line 120. In some embodiments, the carrier gas comprising the precursor pressurizes the reservoir 110 when the outlet valve 135 is closed to a predetermined pressure.

In some embodiments, the precursor delivery system 100 further comprises an inlet valve 125 on the inlet line 120. In some embodiments, the controller 150 is connected to the inlet valve 125 and configured to open and close the inlet valve 125 to charge the reservoir 110 to a predetermined pressure. While not illustrated, the controller 150 can be connected to any of the components using a connection type known to the skilled artisan.

In some embodiments, the inlet valve 125 is opened to charge the reservoir 110 to a predetermined pressure. The pressure in the reservoir 110 can be measured using any pressure measurement device (e.g., pressure gauge 115) known to the skilled artisan. In some embodiments, the inlet valve 125 is closed once the reservoir 110 has reached the predetermined pressure. The pressure gauge 115, or other pressure measurement device, can be located within the interior volume of the reservoir 110, as illustrated in FIG. 1, or can be located along inlet line 120 or outlet line 130. In some embodiments, one or more pressure measurement devices are located in one or more of the inlet line 120, outlet line 130 or reservoir 110.

In some embodiments, the inlet valve 125 is closed whenever the outlet valve 135 is open. In some embodiments, the inlet valve 125 is open whenever the outlet valve 135 is closed. Without being bound by theory, it is believed that only allowing one of the inlet valve 125 and the outlet valve 135 to be open at any given time prevents solid precursor particles from flowing directly from a precursor ampoule into the processing chamber. In some embodiments, the controller 150 is configured to close an open inlet valve 125 or an open outlet valve 135 before opening the other of the inlet valve 125 and outlet valve 135.

In some embodiments, the outlet valve 135 is a fast pulsing valve (also referred to as a fast switching valve or high speed valve) and an orifice 132 between the reservoir 110 and outlet valve 135. In some embodiments, the fast pulsing valve is configured to open and/or close within 50 milliseconds. In some embodiments, the fast pulsing valve is configured to open and/or close within 40 milliseconds, 30 milliseconds, 20 milliseconds or 10 milliseconds. In some embodiments, the fast pulsing valve can open and close within 50, 40, 30, 20 or 10 milliseconds. In some embodiments, the fast pulsing valve is a valve that is either fully open or fully closed. In some embodiments, the fast pulsing valve is a variable open valve that can allow modulation of the flow profile through the valve. In some atomic layer deposition (ALD) process embodiments, the outlet valve is a fast switching valve used to control the delivery of gas to the chamber, and the inlet valve is any valve that a skilled artisan would be familiar with that can operate on the time-scale of the ALD cycle.

The orifice 132 can be any suitable orifice that restricts flow through the outlet line 130. The orifice size depends on, for example, the particular gas flowing through the reservoir and orifice, the operating pressure of the reservoir and/or the flow rate of gas through the orifice. The orifice of some embodiments is a disk-shaped component with a precise aperture extending there through. In some embodiments, the orifice has a size in the range of about 100 μm to about 1500 μm. In some embodiments, the orifice has an In some embodiments, the controller 150 is configured to pressurize reservoir 110 to a pressure sufficient to provide a uniform flow of gas from the reservoir 110 without decreasing the reservoir pressure by more than 25%, by more than 20%, by more than 15%, by more than 10%, by more than 5%, by more than 2%, or by more than 1%. In some embodiments, the reservoir pressure is sufficient so that a uniform flow of gas from the reservoir is provided over the course of a deposition process. In some embodiments, the reservoir pressure is sufficient so that a uniform flow of gas from the reservoir is provided over the length of a precursor delivery pulse.

Without being bound by theory, it is believed that if the reservoir is maintained at a high pressure, the flow of gas provided when the outlet valve 135 is opened will be uniform. As used in this regard, a "uniform gas flow" has a flow rate which varies by less than or equal to about 5%, less than or equal to about 2%, less than or equal to about 1%, or less than or equal to about 0.5% from the beginning of the pulse to the end of the pulse.

The controller 150 is coupled to one or more of the outlet valve 135, the inlet valve 125, and/or the heater 160. In some embodiments, there are more than one controller 150 connected to the individual parts and a primary control processor is coupled to each of the separate processors to control the precursor delivery system 100. The controller 150 may be one of any form of general-purpose computer processor, microcontroller, microprocessor, etc., that can be used in an industrial setting for controlling various chambers and sub-processors.

The controller 150 of some embodiments includes a processor 152, a memory 154 coupled to the processor 152, input/output devices 156 coupled to the processor 152, and support circuits 158 to communication between the different electronic and physical components. The memory 154 can include one or more of transitory memory (e.g., random access memory) and non-transitory memory (e.g., storage).

The memory 154, or computer-readable medium, of the processor may be one or more of readily available memory such as random access memory (RAM), read-only memory (ROM), floppy disk, hard disk, or any other form of digital storage, local or remote. The memory 154 can retain an instruction set that is operable by the processor 152 to control parameters and components of the precursor delivery system 100. The support circuits 158 are coupled to the processor 152 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the operation of the precursor delivery system such that the processes are performed.

In some embodiments, the controller 150 has one or more configurations to execute individual processes or sub-processes to perform the method. The controller 150 can be connected to and configured to operate intermediate components to perform the functions of the methods. For example, the controller 150 can be connected to and configured to control one or more of gas valves, actuators, motors, heaters, etc.

The controller 150 of some embodiments has one or more configurations selected from: a configuration to open the outlet valve; a configuration to close the outlet valve; a configuration to open the inlet valve; a configuration to close the inlet valve; and a configuration to control the heater 160.

In some embodiments, the controller 150 is connected to a heater 160 to maintain the reservoir 110 at a predetermined temperature. In some embodiments, the predetermined temperature is high enough to prevent condensation of the precursor.

In some embodiments, the precursor delivery system 100 comprises a precursor source 170 in fluid communication with the inlet line 120. In some embodiments, the precursor source 170 is maintained at a temperature less than the predetermined temperature of the reservoir 110. In some embodiments, the temperature of the precursor source 170 is high enough to provide a vapor pressure of precursor within the precursor source 170. In some embodiments, the predetermined temperature of the reservoir 110 is high enough to prevent condensation of the precursor within the reservoir.

Figure 2:
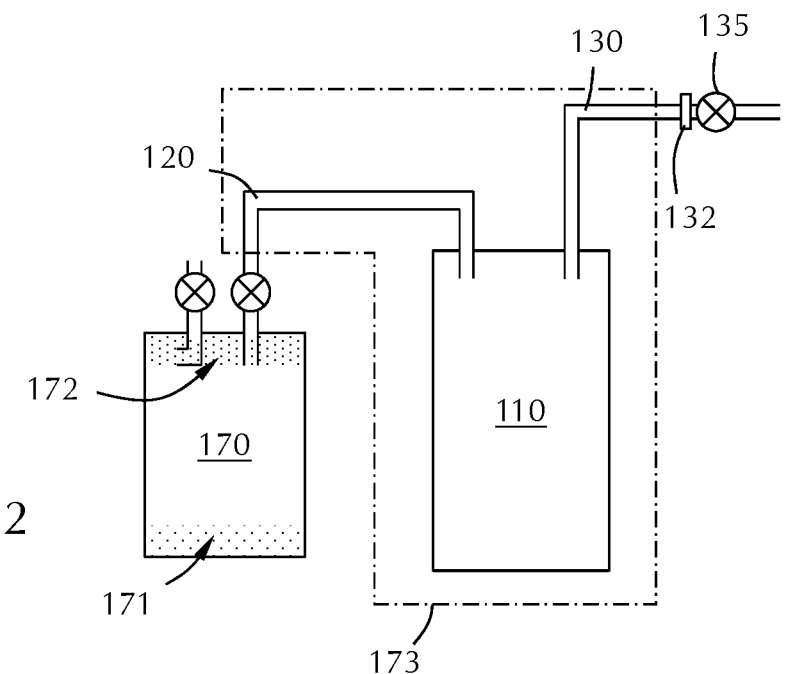
FIG. 2 shows a schematic representation of a precursor delivery system according to one or more embodiments of the disclosure.

Referring to FIG. 2, according to some embodiments, the temperature of the system is controlled at least at three locations. In some embodiments, the bottom of the precursor source 170 (e.g., an ampoule) is maintained at a first temperature 171, the top of the precursor source 170 is maintained at a second temperature 172 greater than the first temperature and the reservoir 110 and portions of the inlet line 120 and outlet line 130 are maintained at a third temperature 173 that is greater than the first temperature and second temperature. Without being bound by any particular theory of operation, it is believed that having the top of the precursor source 170 at a greater temperature (second temperature 172) than the bottom of the precursor source at first temperature 171 helps prevent vapor phase precursor from condensing or redepositing into liquid or solid precursor. Additionally, it is believed that maintaining the third temperature greater than the second temperature will further decrease the likelihood of condensing or deposition within the inlet line 120, reservoir 110 or outlet line 130. In some embodiments, a temperature gradient between the second temperature and first temperature, and/or between the third temperature and second temperature is sufficient to ensure that there is a negligible amount or no accumulation of condensed phase precursor except at the bottom of the precursor source. In some embodiments, the second temperature 172 is at least about 1° C., 2° C., 3° C., 4° C., 5° C., 6° C., 7° C., 8° C., 9° C., 10° C., 11° C., 12° C., 13° C., 14° C., 15° C., 16° C., 17° C., 18° C., 19° C. or 20° C. greater than the first temperature 171. In some embodiments, the third temperature 173 is at least about 1° C., 2° C., 3° C., 4° C., 5° C., 6° C., 7° C., 8° C., 9° C., 10° C., 11° C., 12° C., 13° C., 14° C., 15° C., 16° C., 17° C., 18° C., 19° C. or 20° C. greater than the second temperature 172. In some embodiments, limitations on how the heaters are built and installed increase the temperature setpoint differentials to ensure, within variances, that there are sufficient temperature gradients. In some embodiments, the temperature setpoint of a heater adjacent the top of the precursor source (primarily controlling the second temperature) is in the range of about 5° C. to about 15° C. higher than a heater adjacent the bottom of the precursor source (primarily controlling the first temperature). The setpoints of the heaters in some embodiments depends on the volume the chemical occupies in the condensed phase in the precursor source.

In some embodiments, the precursor source 170 comprises one or more of a facility gas line or a precursor ampoule. In some embodiments, the facility gas line provides a precursor without a carrier gas. In some embodiments, the precursor ampoule provides a precursor which is solid or liquid at room temperature by heating the precursor to provide vaporized precursor within the precursor ampoule. The vaporized precursor is carried by a carrier gas into the reservoir. Referring to FIG. 1, some embodiments of the precursor source 170 include a source inlet line 177 with a source inlet valve 178. The source inlet line 177 of some embodiments is used to flow a carrier gas into the precursor source 170. The source inlet valve 178 of some embodiments allows for isolation of the precursor source 170 to prevent gas entering or leaving the precursor source 170 through the source inlet line 177.

In some embodiments, the precursor delivery system 100 comprises a processing chamber 180 in fluid communication with the outlet line 130. In some embodiments, the controller 150 is configured to open the outlet valve 135 to provide a uniform flow of gas from the reservoir 110 to the processing chamber 180.

Figure 3:
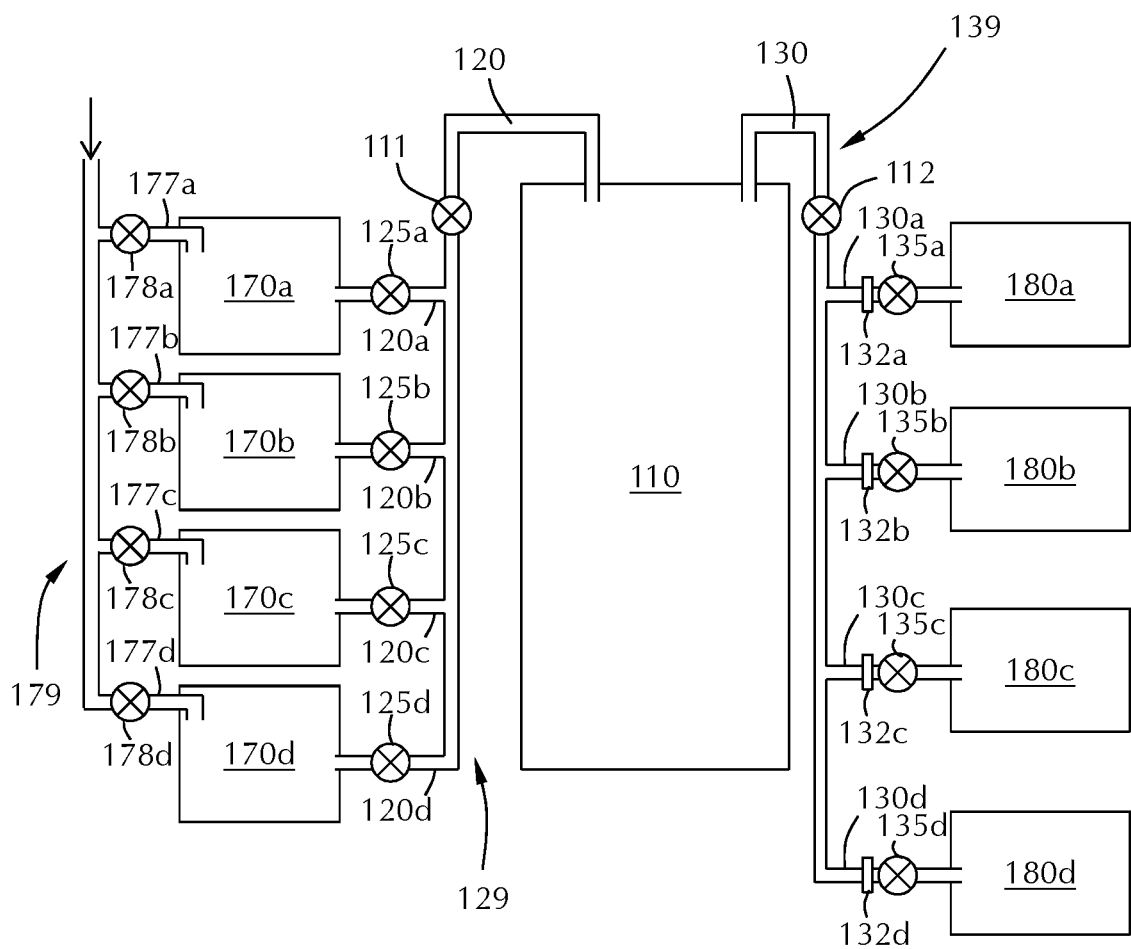
FIG. 3 shows a schematic representation of a precursor delivery system according to one or more embodiments of the disclosure.

Referring to FIG. 3, in some embodiments, the precursor delivery system 100 comprises a plurality of inlet lines 120a, 120b, 120c, 120d, each inlet line 120a, 120b, 120c, 120d, having an inlet valve 125a, 125b, 125c, 125d. The embodiment illustrated in FIG. 3 allows the reservoir 110 to be charged with one or more than one different precursor. Each precursor source 170a, 170b, 170c, 170d has the same precursor or different precursors. For example, each precursor source 170a, 170b, 170c, 170d can have the same precursor which flow into the same reservoir 110 through inlet line 120. In some embodiments, the reservoir may be charged with precursor from several precursor sources 170a, 170b, 170c, 170d. Without being bound by theory, it is believed that the use of multiple precursor sources allows for greater concentrations of precursor within the reservoir. This is expected to be particularly noticeable for precursors with low vapor pressure.

The precursor sources 170a, 170b, 170c, 170d of some embodiments are connected to the reservoir 110 through an inlet manifold 129 connected to inlet line 120, as shown in FIG. 3. In some embodiments, each of the precursor sources 170a, 170b, 170c, 170d is connected to and in fluid communication with the reservoir through separate inlet lines (not illustrated). The inlet line 120 can include an inlet manifold valve 111 to isolate the inlet manifold 129 from the interior of the reservoir 110. The inlet valves 125a, 125b, 125c, 125d of some embodiments are independently controlled to connect the individual precursor source to the inlet manifold 129. This arrangement can, for example, allow for the replacement of one of the precursor sources without stopping a deposition process. The controller of some embodiments is configured to adjust the pressure, flow rate and/or open/close times of the inlet valves to the individual precursor sources to compensate for changes in the numbers of precursor sources connected to the manifold.

In the illustrated embodiment, the outlet valves are positioned between the precursor source and the manifold and are controlled independently (or together) to charge the reservoir 110. The skilled artisan will recognize that the inlet valve can be located between the inlet manifold 129 and the reservoir 110 so that the inlet valves 125a, 125b, 125c, 125d and inlet manifold valve 111 functions and control are reversed. For example, the inlet valves illustrated may serve to connect the precursor source to the inlet manifold 129 and the inlet manifold valve acts as the control valve to charge the reservoir, as inlet valve 125 of FIG. 1 acts.

In some embodiments, each of the precursor sources 170a, 170b, 170c, 170d is connected to a carrier gas source. In the illustrated embodiment, each precursor source is connected to the same carrier gas source through carrier manifold 179 and carrier inlet lines 177a, 177b, 177c, 177d through carrier inlet valves 178a, 178b, 178c, 178d. This allows a single carrier gas source (e.g., a house gas line) to provide carrier gas to all of the precursor sources at the same time while allowing independent control over the gas flow through each of the precursor sources. In some embodiments, each of the precursor sources is connected to separate carrier gas sources and can be independently controller.

In some embodiments, the precursor delivery system 100 comprises a plurality of outlet lines 130a, 130b, 130c, 130d connected to and in fluid communication with outlet line 130 through outlet manifold 139. Each of the outlet lines 130a, 130b, 130c, 130d of some embodiments, as illustrated, has an outlet valve 135a, 135b, 135c, 135d. Each of the outlet lines 130a, 130b, 130c, 130d of some embodiments are connected to one or more processing chambers 180a, 180b, 180c, 180d. Stated differently, in some embodiments, the reservoir 110 may be fluidly connected to multiple processing chambers 180a, 180b, 180c, 180d. In some embodiments, as shown in FIG. 3, each outlet line 130a, 130b, 130c, 130d includes an orifice 132a, 132b, 132c, 132d, as described with respect to FIG. 1. Without being bound by theory, it is believed that the charged reservoir 110 can allows for greater throughput by providing precursor to multiple processing chambers.

In some embodiments, the reservoir 110 is pressurized to a predetermined pressure greater than or equal to the pressure of the processing chamber 180. In some embodiments, the reservoir 110 has a pressure that is about 2 times, about 3 times, about 4 times, about 5 times, about 10 times, about 15 times, about 20 times, about 25 times, about 30 times, about 40 times, about 50 times, about 100 times, about 125 times, about 150 times, about 175 times, about 200 times, about 250 times, about 300 times, about 400 times, about 500 times, about 750 times or about 1000 times the pressure of the processing chamber 180. In some embodiments, the pressure ratio of the reservoir to process cavity in the processing chamber depends on the ratio of the volumes between the reservoir 110 and the process cavity in the processing chamber 180 and on the process flow rate. In some embodiments, the pressure of the reservoir is maintained in the range of about 50 times to about 1000 times, or in the range of about 75 times to about 500 times, or in the range of about 100 times to about 200 times the process chamber pressure. 100 to about 200 times the pressure in the process chamber.

The volume of the reservoir 110 can be any suitable volume smaller than, the same as or larger than the volume of the process cavity in the processing chamber 180. In some embodiments, the reservoir 110 has a smaller volume than the process cavity. In some embodiments, the reservoir 110 has about the same volume (±10%) of the volume of the process cavity. In some embodiments, the volume of the reservoir 110 is greater than the volume of the processing chamber 180. For example, in a process in which a small concentration precursor is delivered with a high flow of carrier/purge gas, the reservoir volume is larger than the process cavity volume. In some embodiments, the reservoir 110 has a volume that is about 1.2 times, about 1.5 times, about 1.75 times, about 2 times, about 3 times, about 4 times, about 5 times, about 7 times, about 10 times, about 15 times, or about 20 times the volume of the processing chamber 180. In some embodiments, the reservoir volume is sufficient so that each pulse is a small fraction of the process cavity volume in the chamber.

Without being bound by theory, it is believed that when the reservoir 110 has a greater pressure than the processing chamber 180, the pulse of precursor delivered when the outlet valve is opened will be of a consistently high pressure as the pressure drop of the reservoir 110 in not substantial. As used in this regard, a pressure drop that is not substantial is less than or equal to about 25%, less than or equal to about 20%, less than or equal to about 15%, less than or equal to about 10%, less than or equal to about 5%, less than or equal to about 2%, or less than or equal to about 1% of the predetermined reservoir pressure before the outlet valve is opened.

Some embodiments of the disclosure relate to methods for delivering a precursor or reactive gas to, for example, a processing chamber. In some embodiments, the methods of the disclosure utilize a precursor delivery system as described herein. The methods according to some embodiments of the disclosure comprise using a controller 150 to charge a reservoir 110 with a precursor. The controller 150 is configured to open an inlet valve 125 on an inlet line 120 and close an outlet valve 135 on an outlet line 130. The inlet line 120 and outlet line 130 are in fluid communication with the reservoir 110. The controller 150 is used to provide a flow of precursor from the charged reservoir 110 through the outlet line 130. The controller is configured to open the outlet valve 135.

Figure 4A:
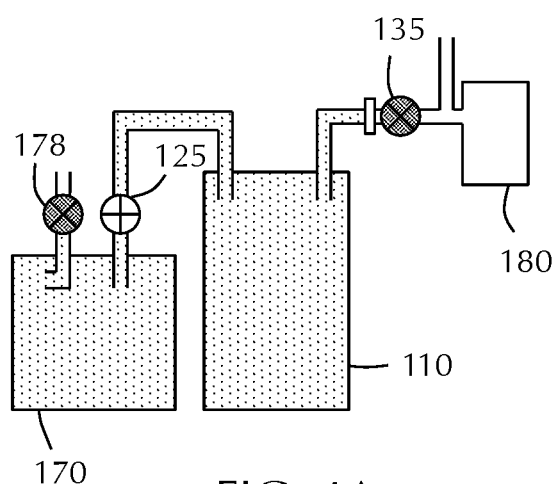
FIGS. 4A through 4D show a method of using a precursor delivery system according to one or more embodiment of the disclosure.

FIGS. 4A through 4D illustrate operation of the precursor delivery system 100 according to one or more embodiments of the disclosure. FIG. 4A illustrates an embodiment of the precursor delivery system 100 prior to wafer processing. Inlet valve 125 is open and outlet valve 135 is closed to maintain a sealed system of the precursor source 170, inlet line 120 and reservoir 110. The ampoule (precursor source 170) headspace is open to the reservoir 110 in which the combined volume is filled with a saturated precursor vapor mixture.

Figure 4B:
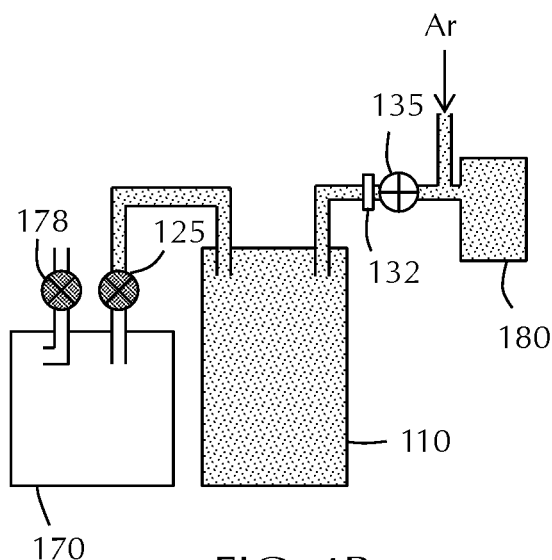

FIG. 4B illustrates an embodiment of the precursor delivery system 100 during a deposition process. Inlet valve 125 and valve 178 are closed to isolate precursor source 170 and isolate the reservoir 110 from the precursor source 170 so that there is no gas flow into either precursor source 170 or reservoir 110. Outlet valve 135 is open to the process chamber to allow the vapor mixture in the reservoir 110 to flow through outlet line 130, orifice 132 and outlet valve 135 to processing chamber 180. In some embodiments, argon (or other inert gas) is co-flowed into the processing chamber 180 through the outlet line 130 downstream of the orifice 132 and outlet valve 135. In some embodiments, the flow rate from the reservoir 110 remains relatively high throughout deposition because the reservoir 110 is charged to a pressure higher than the process chamber 180.

Figure 4C:
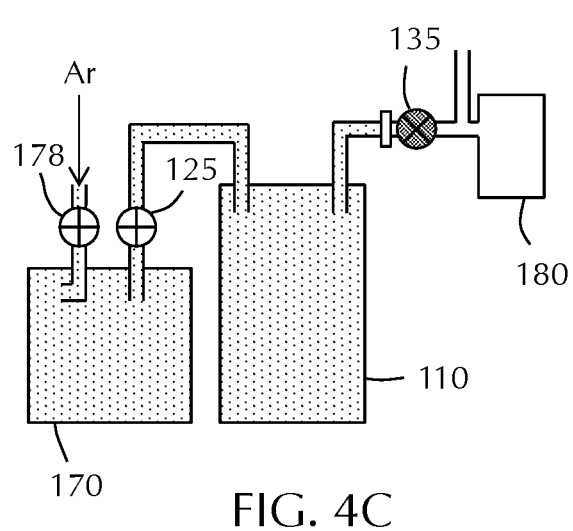

FIG. 4C illustrates an embodiment of the precursor delivery system 100 after a deposition process. The outlet valve 135 is closed to isolate the reservoir 110 from the processing chamber 180. Inlet valve 125 is open to allow fluid communication between the precursor source 170 and reservoir 110 through inlet line 120. Valve 178 is opened to allow argon (or other inert/carrier gas) to flow into the precursor source 170 to pressurize both the precursor source 170 and the reservoir 110. The vapor mixture in the system is allowed to saturate during time between different deposition steps.

Figure 4D:
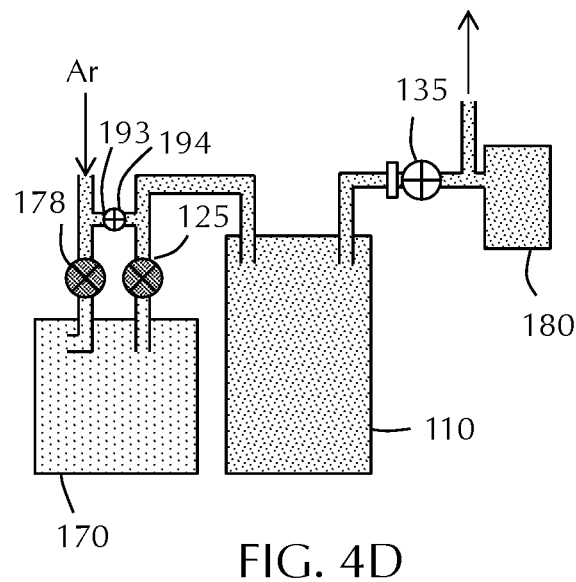

FIG. 4D illustrates an embodiment of the precursor delivery system 100 during long processing chamber idle periods. The inlet valve 125 and valve 178 are closed to isolate the precursor source 170. Outlet valve 135 is opened to allow the reservoir 110 to be pumped out and purged through an ampoule bypass line 193 to exhaust. The ampoule bypass line 193 is shown in FIG. 4D, and omitted from other Figures for ease of description and understanding the drawings. The skilled artisan will recognize the bypass line and bypass valve configurations and will readily understand other configurations that can be used.

In some embodiments, the precursor is continuously provided to the reservoir 110. In some embodiments, the controller 150 is configured to close the inlet valve 125 while the outlet valve 135 is open. In some embodiments, the method further comprises repeating the opening and closing of the outlet valve 135. In some embodiments, the reservoir 110 is charged sufficiently to provide a duty cycle less than about 25%. In some embodiments, the controller 150 is configured to charge the reservoir 110 to a pressure sufficient to provide a uniform flow of gas from the reservoir without decreasing the reservoir pressure by more than 25%.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A precursor delivery system comprising:
    a precursor source comprising an ampoule having a bottom and a top and configured to contain a precursor;
    a reservoir with an inlet line and an outlet line, the inlet line in fluid communication with the precursor source comprising the ampoule;
    the inlet line having an inlet valve;
    an outlet valve on the outlet line; and
    a controller connected to the inlet valve and the outlet valve, the controller configured to open the inlet valve to allow the precursor to be delivered from the precursor source comprising the ampoule to the reservoir, and the controller further configured to close the outlet valve to pressurize the reservoir to a predetermined pressure and open the outlet valve to provide a uniform flow of a reactive gas from the reservoir through the outlet line to a processing chamber.

2. The precursor delivery system of claim 1, further comprising a plurality of inlet lines, each of the plurality of inlet lines having an inlet valve.

3. The precursor delivery system of claim 2, further comprising a plurality of outlet lines, each of the plurality of outlet lines having an outlet valve.

4. The precursor delivery system of claim 1, wherein the controller is configured to pressurize the reservoir to a pressure sufficient to provide the uniform flow of the reactive gas from the reservoir without decreasing pressure from the predetermined pressure by more than 25%.

5. The precursor delivery system of claim 1, wherein the controller is connected to a heater and configured to maintain the reservoir at a predetermined temperature to prevent condensation of the precursor.

6. The precursor delivery system of claim 5, wherein the controller is configured to maintain the precursor source comprising the ampoule at a temperature less than the predetermined temperature of the reservoir.

7. The precursor delivery system of claim 6, wherein the precursor source comprising the ampoule, wherein the bottom is maintained at a first temperature and the top is maintained at a second temperature greater than the first temperature.

8. The precursor delivery system of claim 7, wherein maintaining the top at a greater temperature than the bottom prevents vapor phase precursor from condensing.

9. The precursor delivery system of claim 8, wherein the controller is configured to maintain the temperature of the reservoir at a third temperature greater than the second temperature to prevent condensation of the precursor in the inlet line.

10. The precursor delivery system of claim 8, wherein the controller is configured to open the outlet valve when the inlet valve is closed.

11. The precursor delivery system of claim 10, wherein outlet valve comprises a fast pulsing valve.

12. The precursor delivery system of claim 11, wherein the fast pulsing valve is configured to open and close within 50 milliseconds.

13. The precursor delivery system of claim 4, wherein the uniform flow of gas varies by less than or equal to 5% from a beginning of a pulse of the reactive gas and end of a pulse of the reactive gas from the reservoir to the outlet line.

* * * * *